United States Patent
Aikala et al.

(10) Patent No.: US 9,318,648 B2
(45) Date of Patent: *Apr. 19, 2016

(54) METHOD AND MEANS FOR ENHANCING GREENHOUSE LIGHTS

(75) Inventors: Lars Aikala, Lapinkyla (FI); Ilkka Kivimaki, Helsinki (FI)

(73) Assignee: VALOYA OY, Helsinki (FI)

( * ) Notice: Subject to any disclaimer, the term of this patent is extended or adjusted under 35 U.S.C. 154(b) by 363 days.

This patent is subject to a terminal disclaimer.

(21) Appl. No.: 13/695,518

(22) PCT Filed: Feb. 8, 2012

(86) PCT No.: PCT/FI2012/050117
§ 371 (c)(1),
(2), (4) Date: Oct. 31, 2012

(87) PCT Pub. No.: WO2012/123626
PCT Pub. Date: Sep. 20, 2012

(65) Prior Publication Data
US 2013/0047503 A1    Feb. 28, 2013

Related U.S. Application Data

(60) Provisional application No. 61/468,777, filed on Mar. 29, 2011.

(30) Foreign Application Priority Data

Mar. 17, 2011  (EP) .................................... 11158648

(51) Int. Cl.
*H01L 33/06* (2010.01)
*A01G 7/04* (2006.01)

(52) U.S. Cl.
CPC ................ *H01L 33/06* (2013.01); *A01G 7/045* (2013.01); *Y02P 60/149* (2015.11)

(58) Field of Classification Search
CPC ......... H01L 33/04; H01L 33/06; A01G 7/045
USPC ........ 47/58.1 LS, 58.1 R, DIG. 6, 17, 1.01 R; 977/774; 257/14, 89, E33.008
See application file for complete search history.

(56) References Cited

U.S. PATENT DOCUMENTS 8,008,672 B2 *   8/2011   Moon et al. ...................... 257/79
8,436,334 B2 *   5/2013   Soh et al. ......................... 257/13
(Continued)

FOREIGN PATENT DOCUMENTS

CN    1790756 A      6/2006
WO    99/50916 A1   10/1999
(Continued)

OTHER PUBLICATIONS

Valeria Fattori et al., "Organic light sources look forward to optimize the photosynthesis process", Oct. 17, 2008.*
(Continued)

*Primary Examiner* — Trinh Nguyen
(74) *Attorney, Agent, or Firm* — Young & Thompson

(57) ABSTRACT

An illumination device with a semiconductor light emission solution has a wavelength up conversion feature and is suited for plant cultivation in a greenhouse environment. The best mode is considered to be a light device with at least one blue LED (101) with wavelength up conversion binary alloy quantum dots (110, 120, 130, 140, 150, 160) made by colloidal methods that are arranged to produce an emission spectrum similar to photosynthetically active radiation (PAR) spectrum with the blue LEDs. The methods and arrangements allow more precise spectral tuning of the emission spectrum for lights used in plant cultivation. Therefore unexpected improvements in the photomorphogenetic control of plant growth, and further improvements in plant (310, 311) production are realized. The device is especially advantageous for greenhouses that already have legacy LED systems. These LED systems can often just be upgraded by adding the quantum dot array to arrive at the lighting solution.

7 Claims, 6 Drawing Sheets

(56) References Cited

U.S. PATENT DOCUMENTS

| | | | |
|---|---|---|---|
| 2003/0127659 A1 | 7/2003 | Bawendi et al. | |
| 2004/0259363 A1* | 12/2004 | Bawendi et al. | 438/689 |
| 2006/0049415 A1 | 3/2006 | Liao et al. | |
| 2006/0113895 A1 | 6/2006 | Baroky et al. | |
| 2007/0085092 A1* | 4/2007 | Chen | 257/89 |
| 2008/0173886 A1 | 7/2008 | Cheon et al. | |
| 2010/0051898 A1* | 3/2010 | Kim et al. | 257/9 |
| 2010/0084629 A1 | 4/2010 | Park et al. | |
| 2010/0193806 A1 | 8/2010 | Byun | |
| 2010/0259190 A1* | 10/2010 | Aikala | 315/294 |
| 2010/0283036 A1* | 11/2010 | Coe-Sullivan et al. | 257/13 |
| 2012/0124903 A1* | 5/2012 | Takeuchi | 47/58.1 LS |
| 2013/0255150 A1* | 10/2013 | Karpinski et al. | 47/58.1 LS |
| 2013/0283683 A1* | 10/2013 | Ringbom et al. | 47/58.1 LS |
| 2014/0250778 A1* | 9/2014 | Suntych | 47/1.4 |
| 2014/0268635 A1* | 9/2014 | Aikala et al. | 362/84 |
| 2014/0366439 A1* | 12/2014 | Ben-Dayan et al. | 47/58.1 LS |

FOREIGN PATENT DOCUMENTS

| | | |
|---|---|---|
| WO | 2009/048425 A1 | 4/2009 |
| WO | 2010/053341 A1 | 5/2010 |

OTHER PUBLICATIONS

European Search Report, dated Aug. 29, 2011, from corresponding European application No. 11158648.

International Search Report, dated Apr. 30, 2012, from corresponding PCT application No. PCT/FI2012/050117.

Gioia D. Massa et al., "Plant Productivity in Response to LED Lighting", HortScience, Dec. 2008, pp. 1951-1956, vol. 43, No. 7.

English Translation of the Office Action mailed Aug. 24, 2015 in Chinese counterpart application 201280012688.4.

\* cited by examiner

METHOD AND MEANS FOR ENHANCING GREENHOUSE LIGHTS

TECHNICAL FIELD OF INVENTION

The invention relates to an improved method to produce artificial light for plant cultivation. In more particular, the invention relates to an illumination device with a semiconductor light emission solution that has a wavelength up conversion feature that is suited for plant cultivation in a greenhouse environment.

BACKGROUND

Only approximately 50% of the radiation reaching the surface is photosynthetically active radiation (PAR). PAR is construed to comprise the wavelength region between 300 nm and 800 nm of the electromagnetic spectrum. Photosynthesis together with photoperiodism, phototropism and photomorphogenesis are the four representative processes related to interaction between radiation and plants. The following expression shows the simplified chemical equation of photosynthesis:

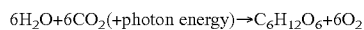

$$6H_2O + 6CO_2 (+\text{photon energy}) \rightarrow C_6H_{12}O_6 + 6O_2$$

The typical absorption spectra of the most common photosynthetic and photo-morphogenetic photoreceptors, such as chlorophyll a, chlorophyll b and betacarotene, and the two interconvertable forms of phytochromes (Pfr and Pr) are presented in FIG. 1A.

The photomorphogenetic responses, contrary to photosynthesis, can be achieved with extremely low light quantities. The different types of photosynthetic and photo-morphogenetic photoreceptors can be grouped in at least three known photosystems: photosynthetic, phytochrome and cryptochrome or blue/UV-A (ultraviolet-A).

In the photosynthetic photosystem, the existing pigments are chlorophylls and carotenoids. Chlorophylls are located in the chloroplasts' thylakoids located in the leaf mesophyll cells of plants. The quantity or the energy of the radiation is the most significant aspect, since the activity of those pigments is closely related to the light harvest. The two most important absorption peaks of chlorophyll are located in the red and blue regions from 625 to 675 nm and from 425 to 475 nm, respectively. Additionally, there are also other localized peaks at near-UV (300-400 nm) and in the far-red region (700-800 nm). Carotenoids such as xanthophylls and carotenes are located in the chromoplast plastid organelles on plant cells and absorb mainly in the blue region.

The phytochrome photosystem includes the two interconvertable forms of phytochromes, Pr and Pfr, which have their sensitivity peaks in the red at 660 nm and in the far-red at 730 nm, respectively. Photomorphogenetic responses mediated by phytochromes are usually related to the sensing of the light quality through the red (R) to far-red (FR) ratio (R/FR). The importance of phytochromes can be evaluated by the different physiological responses where they are involved, such as leaf expansion, neighbour perception, shade avoidance, stem elongation, seed germination and flowering induction. Although shade-avoidance response is usually controlled by phytochromes through the sensing of R/FR ratio, the blue-light and PAR level is also involved in the related adaptive morphological responses.

Blue- and UV-A (ultraviolet A)-sensitive photoreceptors are found in the cryptochrome photosystem. Blue light absorbing pigments include both cryptochrome and phototropins. They are involved in several different tasks, such as monitoring the quality, quantity, direction and periodicity of the light. The different groups of blue- and UV-A-sensitive photoreceptors mediate important morphological responses such as endogenous rhythms, organ orientation, stem elongation and stomatal opening, germination, leaf expansion, root growth and phototropism. Phototropins regulate the pigment content and the positioning of photosynthetic organs and organelles in order to optimize the light harvest and photoinhibition. As with exposure to continuous far-red radiation, blue light also promotes flowering through the mediation of cryptochromes photoreceptors. Moreover, blue-light-sensitive photoreceptors (e.g. flavins and carotenoids) are also sensitive to the near-ultraviolet radiation, where a localized sensitivity peak can be found at around 370 nm.

Cryptochromes are not only common to all plant species. Cryptochromes mediate a variety of light responses, including the entrainment of the circadian rhythms in flowering plants such as the *Arabidopsis*. Although radiation of wavelengths below 300 nm can be highly harmful to the chemical bonds of molecules and to DNA structure, plants absorb radiation in this region also. The quality of radiation within the PAR region may be important to reduce the destructive effects of UV radiation. These photoreceptors are the most investigated and therefore their role in control of photosynthesis and growth is known reasonably well. However, there is evidence of the existence of other photoreceptors, the activity of which may have an important role in mediating important physiological responses in plants. Additionally, the interaction and the nature of interdependence between certain groups of receptors are not well understood.

Many plants can be grown in a different geographical location to their natural habitat by means of greenhouse cultivation utilising artificial light. It is known from WO 2010/053341 A1 by Zukauskas et al. that light emitting diodes (LEDs) can be used with phosphor conversion to satisfy some of the photomorphogenetic needs of plants. Phosphor conversion operates so that there is a light such as an LED that emits at a short wavelength adjacent to a phosphor component that absorbs and re-emits the radiation at a longer wavelength. This way the aggregate emission spectrum of the lighting device can be tuned, so that the photons provided to the plant allow the plant to grow in a certain way, e.g. to meet some morphological objectives such as stem height. This document is cited here as reference.

Light emitting diodes (LEDs) are increasing in popularity every day. A peculiar new structure used for LEDs is the quantum dot that is a semiconductor whose excitons are confined in all three spatial dimensions. Quantum dots have been suggested to be used to get rid of phosphor in WO 2009/048425 that discusses a multiple quantum well structure (MQW) comprising quantum dots. According to this publication, the MQW structure can be used to produce a phosphor free red and white nitride based LED. This document is also cited here as reference.

The prior art has considerable disadvantages. The prior art LEDs and phosphor arrangements do not allow sufficiently high resolution tuning of the emission spectra. The prior art MQW and quantum dot illumination devices are mainly focused on replacement of disadvantageous architectural features (such as phosphorus), which is of little help to a horticulturalist.

Quite clearly more sophisticated plant illumination technologies are needed that do more than merely replace unwanted technological features, i.e. enhance cultivation productivity also.

SUMMARY

The invention under study is directed towards a system and a method for effectively up converting LED emission with quantum dots to produce an optimised spectrum for plant cultivation.

A further object of the invention is to present a system and a method for effectively up converting LED emission with quantum dots to produce an optimised spectrum for plant cultivation in a greenhouse environment where filtered sunlight needs to be complemented by the artificial light of the invention.

In one aspect of the invention the quantum confinement is realised as a quantum dot, i.e. confinement in all 3-spatial dimensions, or indeed as a plurality of quantum dots. Besides using quantum dots, quantum wires (2-D spatial confinement) and quantum wells (1-D spatial confinement) can be used to implement the invention in some embodiments, for example by replacing one or more quantum dots from said embodiments.

According to one aspect of the invention, at least one conventional LED is arranged to illuminate quantum dots of different sizes. In quantum dots the size inversely correlates with the emission energy, i.e. smaller quantum dots emit higher energies. The quantum dots are arranged to absorb photons emitted by the LED, and subsequently re-emit photons at a longer wavelength. In one aspect of the invention the size distribution of quantum dots is selected so that it produces an aggregate emission spectrum with the LEDs that produces favourable photomorphogenetic effects for the plants that are being cultivated with the artificial light emitted by said LED and quantum dot-combination.

It is an aim of the present invention to eliminate at least a part of the problems relating to the art and to provide a new way of facilitating plant growth using LEDs and quantum dots as up converters of said LEDs in combination.

It is a first objective of the invention to provide a single light emission source based LED and quantum dot device to which the photosynthesis process responds well.

It is a second objective of the invention to provide a lighting fixture for greenhouse cultivation based on a photosynthesis photon flux (PPF) optimized LED and quantum dot device.

It is a third objective of the invention to achieve a LED and quantum dot device that provides at least two emission peaks in the wavelength range from 300 to 800 nm and at least one of the emission peaks has Full Width at Half Maximum (FWHM) of at least 50 nm or more.

It is a fourth objective of the invention to provide a LED and quantum dot based greenhouse cultivation lighting fixture wherein the emission intensity ratio of two emission frequencies, 300-500 nm and 600-800 nm, are reduced with less than 20% during the 10,000 hours of operation.

It is a fifth objective of the invention to provide a technical solution giving a better PPF value per Watt (i.e. PPFs against used power wattage) than attained by a conventional high pressure sodium or LED lamp normally used in greenhouse cultivation and thus providing an energy efficient light source for greenhouse cultivation process and artificial lighting used therein.

It is a sixth objective of the invention to provide a single light emission source wherein the emission at a frequency of 300-500 nm is generated by the semiconductor LED chip and the emission at a frequency of 600-800 nm is generated using an up converting quantum dot chip. The inventor has discovered that for example cucumber and lettuce plants reach greater length and/or mass when illuminated with the inventive horticultural light that includes far red light (700-800 nm).

It is a seventh objective of the invention to provide a single light emission source where the emission at frequency of 300-500 nm is generated by the semiconductor LED chip and the emission at frequency of 600-800 nm is generated using a quantum dot chip, which is either partially driven by electric current for light emission, or completely operates as an wavelength up-converter of the said LED chip. The wavelength up-conversion to produce 600-800 nm radiation is achieved by using one or more wavelength up-conversion quantum dots in proximity of the LED chip emission source.

In this application "up-conversion" is construed as changing the wavelength of incoming absorbed light to emitted light of longer wavelengths.

It is an eighth objective of the invention to provide 400-500 nm, 600-800 nm or both frequency ranges partial or complete wavelength up-conversion of semiconductor LED chip radiation, the chip having emission at 300-500 nm range emission range. The wavelength up-conversion is realized by using a quantum dot that is either organic, inorganic or combination of both types of materials.

It is a ninth objective of the invention to provide the wavelength up-conversion using nano-sized particle material for the up-conversion.

It is a tenth objective of the invention to provide the wavelength up-conversion using molecular like material for the up-conversion.

It is an eleventh objective of the invention to provide the wavelength up-conversion using a polymeric material wherein the up-conversion material is covalently bonded to the polymer matrix providing the wavelength up-conversion.

It is a twelfth objective of the invention to present a LED and quantum dot based lighting fixture where the spectral band 500-600 nm is suppressed. In this suppressed band there is hardly any or no emission at all, or in any case less emission than in either of the adjacent bands 400-500 nm, 600-700 nm. The suppression can be achieved in accordance with the invention by not having any or only a small amount of primary emission in the band 400-500 nm, and by making sure that any up-conversion causes a wavelength shift that shifts the wavelength beyond 600 nm. It is generally known that green plants cannot utilize green light (500-600 nm) radiation as well as the radiation in the adjacent bands, as this radiation merely reflects from the plant rather than is being absorbed for photosynthetic conversion.

It is a thirteenth objective of the invention to present a LED and a quantum dot based lighting fixture that maximizes anabolic growth of plants by providing desired far-red light, whereas it minimizes green light which from the perspective of plant cultivation is radiation that wastes energy. This objective is realized in one aspect of the invention by a blue LED light emitter with a wavelength up-conversion quantum dot device which up-converts part of the emitted blue light (300-500) nm into a broad red spectrum component (600-800 nm) which has a far-red component, but omits and/or minimizes the green component (500-600 nm).

The present invention provides a LED and a quantum dot and a related light fixture suitable for greenhouse cultivation. According to the invention, both the LED and the quantum dot have specific emission frequency patterns, viz. it has at least two spectral characteristics; one emission peak with a full width at half maximum of at least 50 nm or more and having a peak wavelength in the range of 600 to 700 nm, and a second spectral characteristics having a peak wavelength below 500 nm range. The emission peaks of the LEDs and quantum dots match well with a plant photosynthesis response spectrum and is therefore particularly suitable for high efficiency artificial lighting.

Some or all of the aforementioned advantages of the invention are accrued with a LED and a quantum dot size distribution that optimises the emission spectrum for the said photomorphogenetic variable affected, which can be any of the following biological parameters: weight, leaf number, root mass, stem height, chemical composition (such as vitamin, mineral, and/or nutrient content and/or concentration) of the plant at different time points or at harvesting maturity.

A lighting device for plant cultivation comprising a LED is in accordance with the invention and characterised in that said lighting device comprises a plurality of quantum dots of different size arranged to up convert LED light to longer wavelengths.

A lighting method for plant cultivation is in accordance with the invention and comprises the step of illuminating plants and quantum dots with at least one LED and is characterised in that, light is absorbed by a plurality of quantum dots of different size, light is emitted by a plurality of quantum dots of different size at wavelengths longer than the absorbed radiation.

A lighting method for plant cultivation is in accordance with the invention and comprises the steps of, at least one plant and a plurality of quantum dots of different size is illuminated with at least one LED, light is absorbed by said plurality of quantum dots of different size, light is emitted by said plurality of quantum dots of different size at wavelengths longer than the absorbed radiation.

A greenhouse and/or growth chamber light device is in accordance with the invention and characterised in that said light device comprises at least one quantum dot and at least one LED.

A horticultural lighting fixture is in accordance with the invention and comprises at least one quantum dot and at least one LED having a) first spectral characteristics including a peak in the wavelength range from 600 to 700 nm and arranged to exhibit a full width of half maximum of at least 50 nm or more;

b) second spectral characteristics with a maximum of 50 nm full width of half maximum and arranged to exhibit a peak wavelength in the range from 440 to 500 nm, and c) all or part of the emission at a frequency of 600-800 nm is generated using a whole or partial wavelength up-conversion of the LED chip radiation power by the at least one quantum dot.

A horticultural lighting fixture is in accordance with the invention and comprises at least one LED and at least one quantum dot arranged to up convert emitted radiation from said LED having a) first spectral characteristics including a peak in the wavelength range from 600 to 700 nm and arranged to exhibit a full width of half maximum of at least 50 nm or more;

b) second spectral characteristics with a maximum of 50 nm full width of half maximum and arranged to exhibit a peak wavelength in the range from 440 to 500 nm, and c) at least a part or the whole of the emission at wavelengths of 500-600 nm is arranged to be minimized and/or omitted and/or to be reduced below the intensity in 400-500 nm band and below the intensity in 600-700 nm band.

Use of the lighting device or fixture of any of the five preceding paragraphs is in accordance with the invention in providing light for at least one plant with the said at least one plant in ambient light or in a dark cavity with said lighting device or fixture as the sole source of light. Similarly a method for enhancing plant growth of the five preceding paragraphs is in accordance with the invention wherein at least one lighting device or fixture emits light to at least one plant with the said at least one plant in ambient light or in a dark cavity with said lighting device or fixture as the sole source of light.

A light emitting component of a horticultural light, comprising;

a light emitting diode (LED) semiconductor chip; and a light wavelength up-conversion quantum dot which is deposited in direct proximity of the said LED chip;

said component being capable of emitting two characteristic light emission peaks, and at least a part or the whole of the emission at wavelengths of 500-600 nm is arranged to be minimized and/or omitted and/or to be reduced below the intensity in 400-500 nm band and below the intensity in 600-700 nm band.

Use of the light emitting component of the preceding paragraph, is in accordance with the invention, in providing light for at least one plant with the said at least one plant in ambient light or in a dark cavity with said lighting device or fixture as the sole source of light. Similarly a method for enhancing plant growth, is in accordance with the invention, wherein at least one light emitting component of the preceding paragraph emits light to at least one plant with the said at least one plant in ambient light or in a dark cavity with said lighting device or fixture as the sole source of light.

The LED emitter and quantum dot up converter based implementations of the invention allow very fine spectral tuning of the emission spectrum, and therefore very good energy efficiency and improved photomorphogenetic control in plant cultivation relying on artificial light. This advantage is even more pronounced when using a very fine distribution of quantum dots only for up conversion, as the spectral tuning provided by them is superior to conventional LEDs. Furthermore, the quality of the harvests is considerably improved with the light devices of the invention and this brings a multitude of advantages related to cultivation in dark growth chambers or chambers with very limited ambient light: Firstly plants may be grown closer to the site of consumption, e.g. in residential basements in big cities, thereby eliminating transportation costs. Secondly, plants may be grown in geographies where agriculture is not traditionally possible, e.g. hot desert conditions in the summer Thirdly, as the quality of the plants is improved also the consistency between individual plants is improved which makes harvesting easier. This is because there are less rejected individuals and machine vision based harvesting equipment can recognize the plants better when they have a consistent quality, size and colour. Fourthly, the properties of the plants may be varied in a controlled fashion because nearly all growth parameters are under control, which is especially advantageous when cultivating flowers and ornamental plants. Fifthly, a constant photon dose everyday for the plants assists in the administration of nutrients, as the nutrient dose can be maintained the same year round. Sixthly, in very hot and sunny geographies plants may be grown in dark opaque growth chambers that reflect sunlight. The energy spent in the artificial illumination of the invention is considerably less than what would have been expended in air conditioning or cooling the plant under sunlight.

It should be noted that a dark cavity is construed as a light constrained space that has zero or low levels of sunlight and/or ambient light without the artificial light source of the invention emitting photons, but the said cavity can be of any size, microscopically small, a flower pot size, a 10 m² residential/business basement, a shipping cargo container, the size or a football field, e.g. basement of a football stadium, and/or a skyscraper with 20 floors where enough vegetables are grown for an entire city at one or more floors.

In addition and with reference to the aforementioned advantage accruing embodiments, the best mode of the invention is considered to be a lighting device with a blue LED and up converting binary alloy quantum dots made by colloidal methods to produce a size distribution of quantum dots that produces an emission spectrum otherwise similar to photosynthetically active radiation (PAR) spectrum except that the emission spectrum omits or provides a very low intensity in the green yellow (500-600) nm and comprises a high intensity spectral feature in the far red 700-800 nm band.

BRIEF DESCRIPTION OF THE DRAWINGS

In the following the invention will be described in greater detail with reference to exemplary embodiments in accordance with the accompanying drawings, in which.

Some of the embodiments are described in the dependent claims.

DETAILED DESCRIPTION OF EMBODIMENTS

Figure 1A:
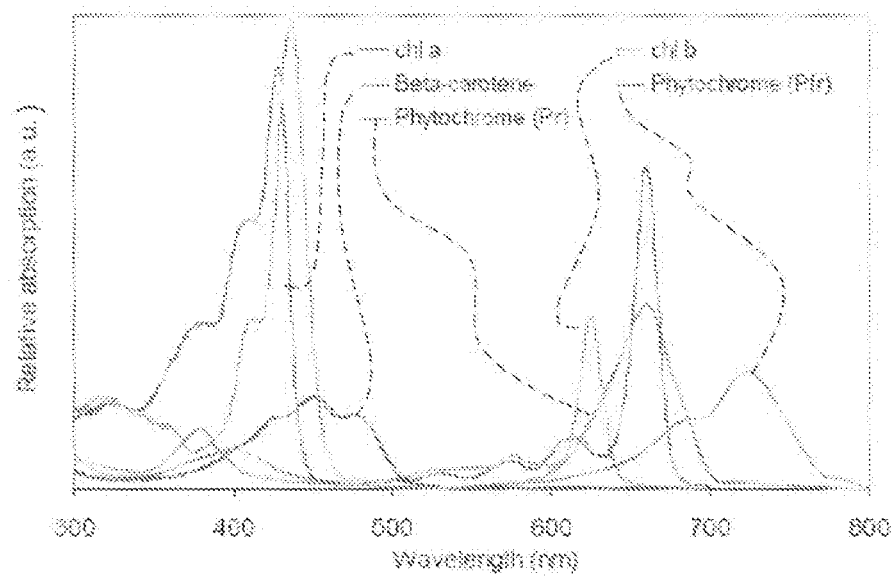
FIG. 1A shows relative absorption spectra of the most common photosynthetic and photomorphogenetic photoreceptors in green plants.
Figure 1B:
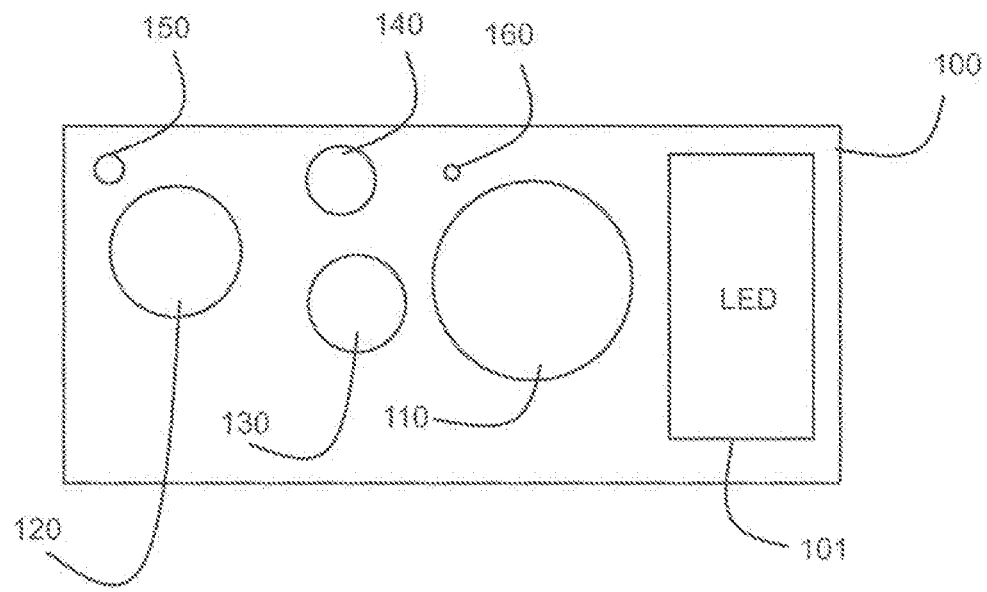
FIG. 1B demonstrates an embodiment of the inventive lighting device 10 as a block diagram.

FIG. 1 shows a lighting device 100 comprising a plurality of quantum dots 110, 120, 130, 140, 150 and 160 of different sizes. The size distribution of quantum dots comprises quantum dots of different sizes within the range of 2 nm-200 nm, i.e. quantum dot 110 typically having a diameter of 200 nm and quantum dot 160 having a diameter of approximately 2 nm. The lighting device typically comprises also a LED 101, which is preferably blue or has some other shorter wavelength.

As the LED 101 emits light, some of the emitted photons are absorbed by the quantum dots 110, 120, 130, 140, 150 and 160. As the photons are absorbed, electrons in the quantum dots 110, 120, 130, 140, 150 and 160 are excited to higher energy states. These electrons subsequently relax from the higher energy states to lower energy states by emitting one or more photons of energy equal to the difference between the said higher and lower energy states.

In some embodiments the quantum dots 150, 160 are arranged to transmit UV/blue light in the 250-400 nm range or are completely removed, the quantum dots 140 and 130 are arranged to transmit green and/or yellow light 400-600 nm or are completely removed, and quantum dot 120 is arranged to transmit red light 600-700 nm, and the quantum dot 110 is arranged to transmit far red light in the band of 700-800 nm.

The relative emission intensity and number of quantum dots 110, 120, 130, 140, 150 and 160 of certain size is varied to produce an aggregate emission spectrum combined with the emission spectrum of LED 101 that is similar and/or identical to photosynthetically active radiation (PAR) spectrum in some embodiments. Even more preferably, the said PAR resembling emission spectrum omits or provides a very low intensity in the green yellow (500-600) nm and comprises a high intensity spectral feature in the far red 700-800 nm band.

All or some of the quantum dots 110, 120, 130, 140, 150 and 160 are typically manufactured from any of the following alloys: cadmium selenide, cadmium sulphide, indium arsenide, indium phosphide and/or cadmium selenide sulphide in some embodiments.

It should be noted that in more elaborate embodiments the size of at least one said quantum dot 110, 120, 130, 140, 150 and/or 160 is chosen so that said quantum dot produces photon emission in a band that has a certain photomorphogenetic effect in plants. The said photomorphogenetic variable effected could be any of the following biological parameters: weight, leaf number, root mass, stem height, chemical composition (such as vitamin, mineral, and/or nutrient content and/or concentration) of the plant at different time points or at harvesting maturity in some embodiments of the invention.

In some embodiments at least one said quantum dot 110, 120, 130, 140, 150 and/or 160 is produced by colloidal synthesis. In colloidal synthesis colloidal semiconductor nanocrystals are synthesized from precursor compounds dissolved in solutions, much like traditional chemical processes. Typically the synthesis of colloidal quantum dots is based on a three-component system composed of: precursors, organic surfactants, and solvents. The reaction medium is heated to a sufficiently high temperature, and the precursors chemically transform into monomers. Once the monomers reach a high enough supersaturation level, the nanocrystal growth starts with a nucleation process. The temperature during the growth process is one of the critical factors in determining optimal conditions for the nanocrystal growth in some embodiments. The temperature is typically high enough to allow for rearrangement and annealing of atoms during the synthesis process while being low enough to promote crystal growth. Another critical factor that is controlled during nanocrystal growth is the monomer concentration in some embodiments.

The growth process of nanocrystals can occur in two different regimes, which can be described as "focusing" and "defocusing". At high monomer concentrations, the critical size (the size where nanocrystals neither grow nor shrink) is relatively small, resulting in growth of nearly all particles. In this regime, smaller particles grow faster than large ones, since larger crystals need more atoms to grow than small crystals, and this results in "focusing" of the size distribution to yield nearly monodisperse particles. The size focusing typically is optimal when the monomer concentration is kept such that the average nanocrystal size present is always slightly larger than the critical size. When the monomer concentration is depleted during growth, the critical size becomes larger than the average size present, and the distribution "defocuses" as a result of Ostwald ripening.

There are colloidal methods to produce many different semiconductors. Typical dots of the invention are made of binary alloys such as cadmium selenide, cadmium sulfide, indium arsenide, and indium phosphide. Although, dots may also be made from ternary alloys such as cadmium selenide sulfide in some embodiments of the invention. These quantum dots can contain as few as 100 to 100,000 atoms within the quantum dot volume, with a diameter of 10 to 50 atoms. This corresponds to about 2 to 10 nanometers.

It is in accordance with the invention to produce different populations of quantum dots by different methods of colloidal synthesis, or other methods, and then combine the said populations with one or more LEDs to yield a size distribution that provides the desired total emission spectrum that is preferred for plant cultivation.

It should also further be noted that the embodiment 10 can be readily permuted and/or combined with any of the embodiments 20, 30, 31, 40, 50, 60, 70 and/or 80.

Figure 2:
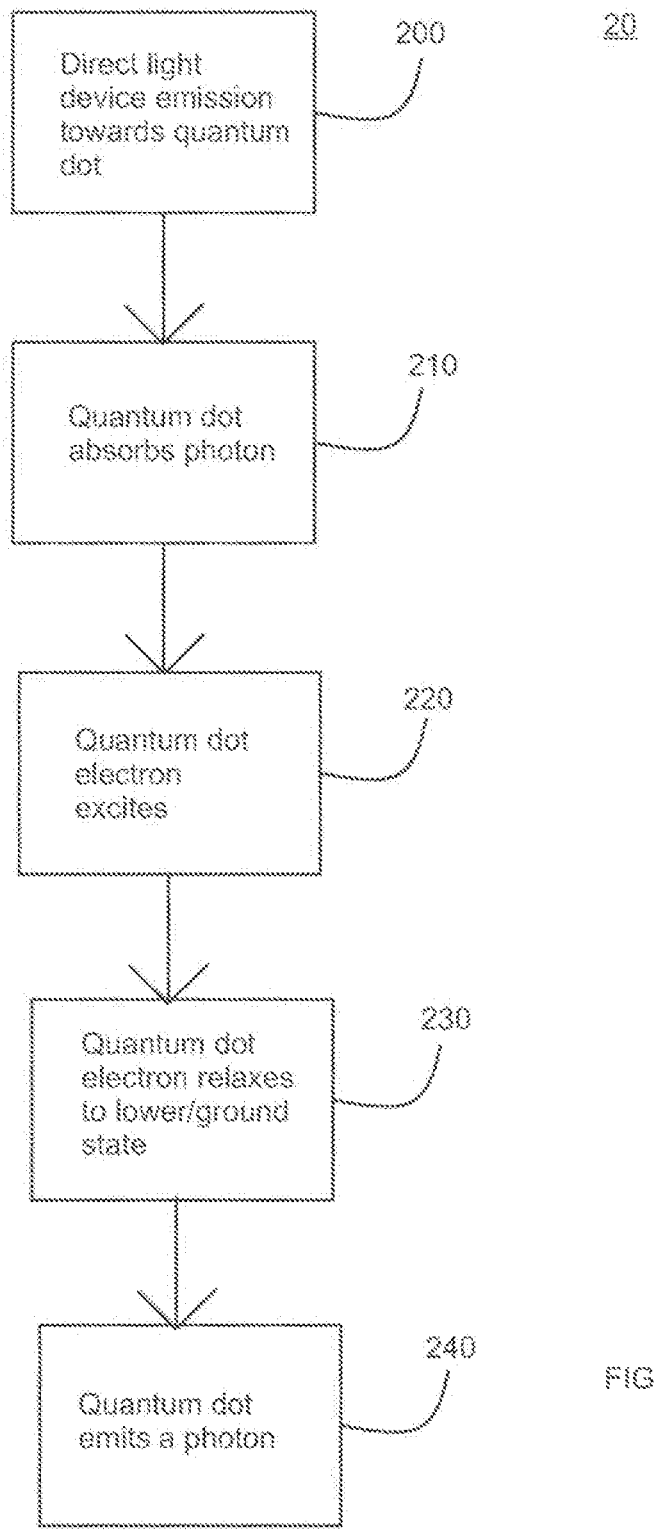
FIG. 2 demonstrates an embodiment 20 of the lighting method in accordance with the invention as a flow diagram.

FIG. 2 shows the operation of the lighting device of the invention, for example in a greenhouse environment. In phase 200 light emission is directed from the LED towards at least one plant and at least one quantum dot.

In phase 210 the quantum dot absorbs a photon, which is typically a photon that has been emitted by the LED and has a wavelength in the 250-400 nm range. This photon excites an electron in a quantum dot to a higher energy state in phase 220.

As the electron relaxes to a lower energy state, it emits a photon with a wavelength dictated by the energy difference between the excited and the relaxed state in phases 230 and 240. These emitted photons, together with the LED photons that are not absorbed, end up directly at the plant, and produce the emission spectrum that is transmitted from the lighting device.

In some embodiments UV/blue light in the 250-400 nm range, green and/or yellow light in the 400-600 nm range, red light 600-700 nm, and/or far red light in the band of 700-800 nm are emitted by at least one LED and at least one quantum dot of different sizes in the method of the invention. Typically larger quantum dots emit red light of longer wavelength and smaller quantum dots and LEDs blue light of shorter wavelengths in some embodiments of the invention. Therefore, in the preferred wavelength up conversion embodiment the at least one LED transmits UV/blue light in the 250-400 nm range, and there are mainly bigger quantum dots associated with the LED that absorb all or some of the said 250-400 nm wavelength photons, and emit light in the 400-600 nm range, red light 600-700 nm, and/or far red light in the band of 700-800 nm.

It should also further be noted that the embodiment 20 can be readily permuted and/or combined with any of the embodiments 10, 30, 31, 40, 50, 60, 70 and/or 80.

Figure 3:
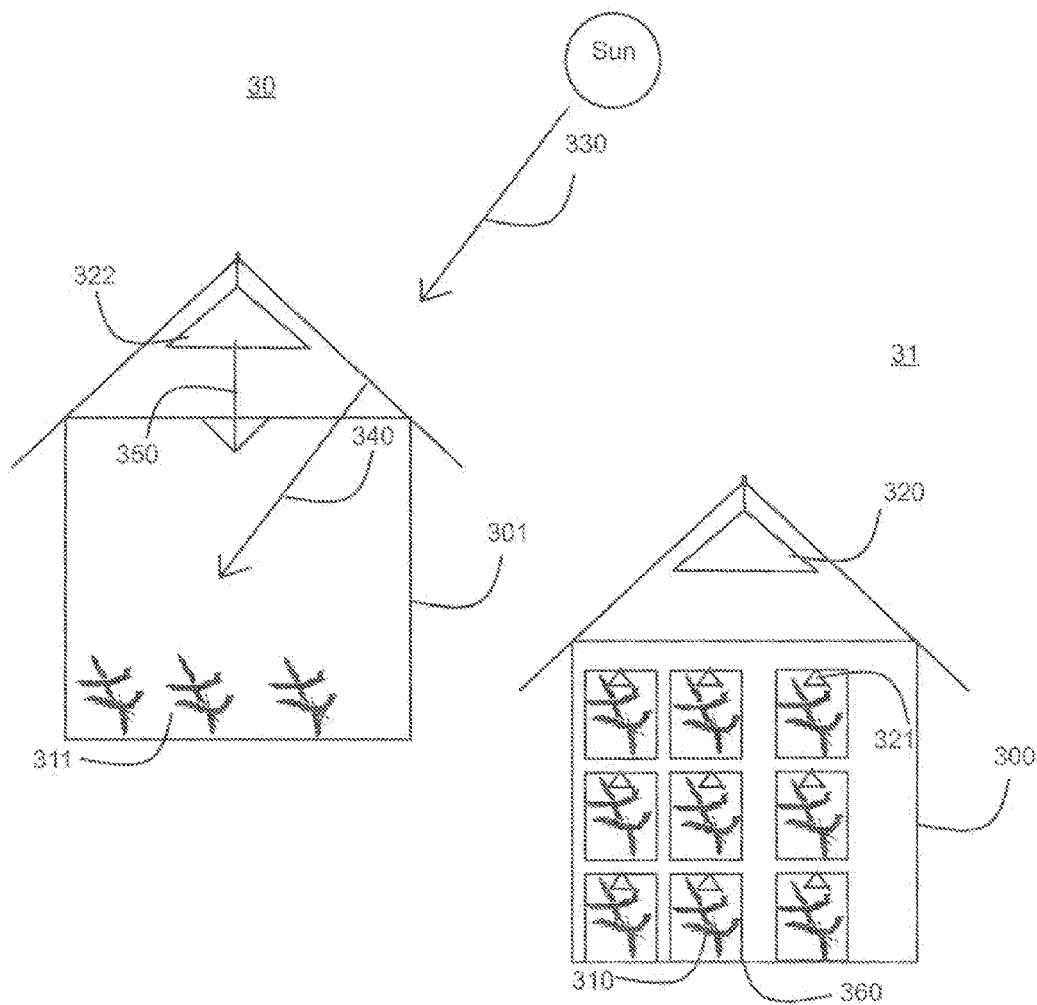
FIG. 3 demonstrates embodiments 30 and 31 of the use of the inventive lighting device as a block diagram.

FIG. 3 shows different use configuration embodiments 30 and 31 of the inventive artificial greenhouse illumination device and method. In one embodiment 30 the plants 311 are cultivated on the floor of a greenhouse with transparent walls 301. A lighting device 322 with a LED and a plurality of quantum dots is located in a position from where photons emitted by it can reach as many plants 311 as possible with maximum emission flux. In some embodiments the emission spectrum 350 of the lighting device is adjusted to complement the natural light spectrum that is the sunlight that is transmitted through the wall 301. In some embodiments the lighting device 322 may comprise a LED and quantum dots arranged to transmit those wavelengths that are filtered and/or attenuated by the greenhouse walls in accordance with the invention.

In embodiment 31 the plants to be cultivated are stacked in growth chambers 360 in the greenhouse 300. In some embodiments each growth chamber has a lighting device 321. Even if the plants are stacked in transparent growth chambers, there is a greater reduction and/or attenuation of sunlight than in embodiment 30 as some of the photons need to transmit through more than one transparent wall. Therefore, the lighting device 321 with at least one LED and quantum dots typically complements the natural light spectrum of multiple transmissions as above, or in the case of an opaque chamber provides all light radiation to plants 310. In some embodiments there are both dedicated lighting devices for growth chambers and at least one lighting device 320 shared by more than one plant in one or more growth chambers 360.

In some embodiments the at least one LED and quantum dots are arranged to produce an emission spectrum that when combined with transmitted spectrum 340 is similar to photosynthetically active radiation (PAR) spectrum. Even more preferably spectrum 340 is otherwise similar to PAR spectrum but omits or provides a very low intensity in the green yellow (500-600) nm and comprises a high intensity spectral feature in the far red 700-800 nm band. In some embodiments at least one LED and/or quantum dot in the lighting device is chosen so that it emits photons in a band in the photon spectrum which band has a certain photomorphogenetic effect in plants. The said photomorphogenetic variable effected could be any of the following biological parameters: weight, leaf number, root mass, stem height, chemical composition (such as vitamin, mineral, and/or nutrient content and/or concentration) of the plant 310, 311 at different time points or at harvesting maturity.

The embodiments 30, 31 are also suited to be implemented with growth chambers 360 of any level of opaqueness or transparency.

It should also further be noted that the embodiments 30 and 31 can be readily permuted and/or combined with each other and/or with any of the embodiments 10, 20, 40, 50, 60, 70 and/or 80.

Figure 4:
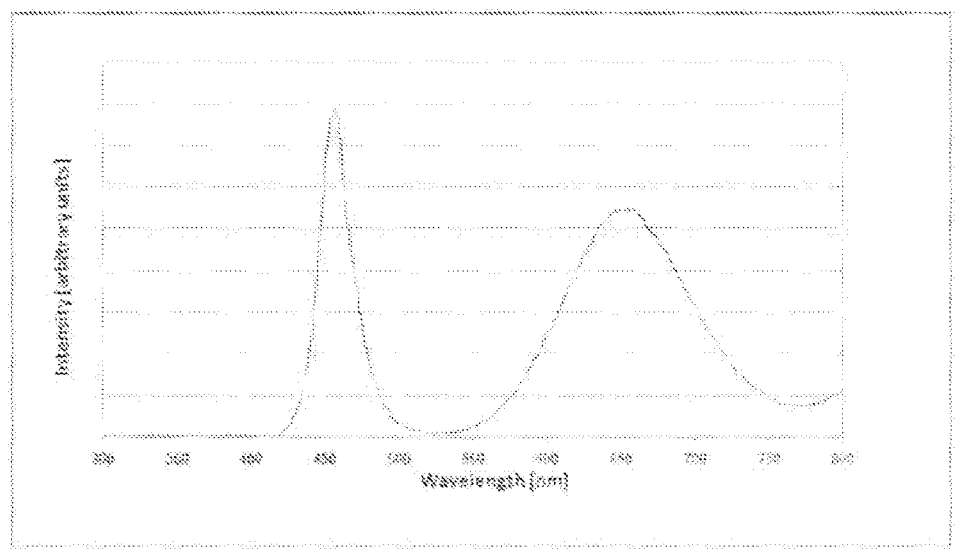
FIG. 4 shows the embodiment 40 with emission peaks of a first single light emission source LED and quantum dot device according to the invention.

In FIG. 4, the semiconductor LED chip emission frequency peaks at a wavelength of 457 nm with emission peak Full Width at Half Maximum (FWHM) of 25 nm. In this case the wavelength up-conversion is done by using two quantum dot up-conversion materials. These two wavelength up-conversion materials have individual emission peaks at 660 nm and 604 nm. FIG. 4 shows the combined emission peak from these two wavelength up-conversion materials peaking at 651 nm wavelength with emission peak FWHM of 101 nm. In this case about 40% (calculated from the peak intensities) of the semiconductor LED chip emission, is up-converted to 651 nm emission by two individual up-conversion quantum dot materials.

It should be noted that the spectrum 40 can be used and implemented together with conventional LEDs. Spectrum 40 can be implemented by at least one quantum dot and at least one LED in combination in accordance with the invention. The spectrum 40 is especially suited to be used for illuminating at least one plant in a dark growth cavity, or a cavity with low levels of ambient light.

It should also further be noted that the embodiment 40 can be readily permuted and/or combined with any of the embodiments 10, 20, 30, 31, 50, 60, 70 and/or 80.

Figure 5:
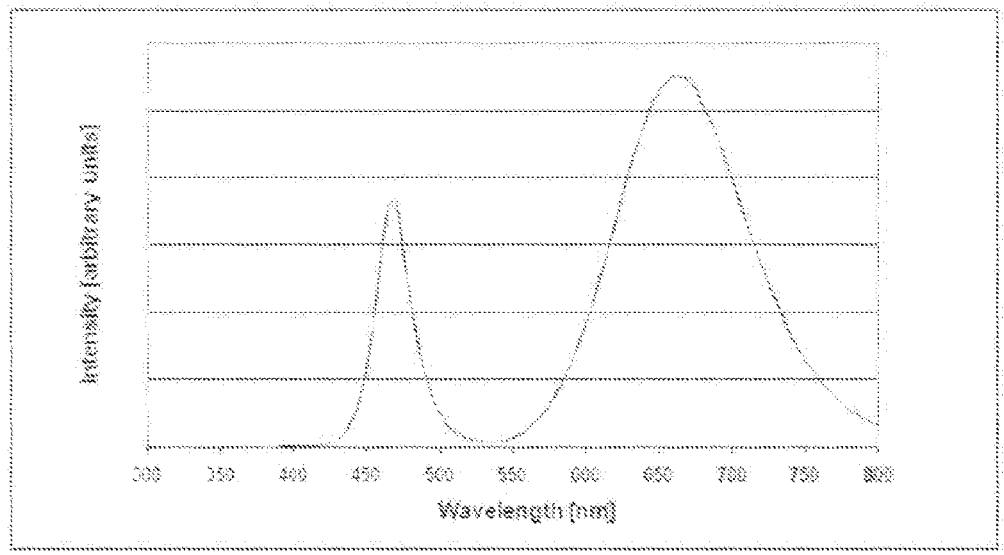
FIG. 5 shows the embodiment 50 with the emission peaks of a second single light emission source LED and quantum dot device according to the invention.

In FIG. 5, the semiconductor LED chip emission frequency peaks at a wavelength of 470 nm with emission peak Full Width at Half Maximum (FWHM) of 30 nm. In this case the wavelength up-conversion is done by using two quantum dot up-conversion materials. These two wavelength up-conversion materials have individual emission peaks at 660 nm and 604 nm. FIG. 5 shows the combined emission peak from these two wavelength up-conversion materials peaking at 660 nm wavelength with emission peak FWHM of 105 nm. In this case about 60% (calculated from the peak intensities) of the semiconductor LED chip emission, is up-converted to 660 nm emission by two individual quantum dot "up-conversion" materials.

It should be noted that the spectrum 50 can be used and implemented together with conventional LEDs. Spectrum 50 can also be implemented by at least one quantum dot and at least one LED in combination in accordance with the invention. The spectrum 50 is especially suited to be used for illuminating at least one plant in a dark growth cavity, or a cavity with low levels of ambient light.

It should also further be noted that the embodiment 50 can be readily permuted and/or combined with any of the embodiments 10, 20, 30, 31, 40, 60, 70 and/or 80.

Figure 6:
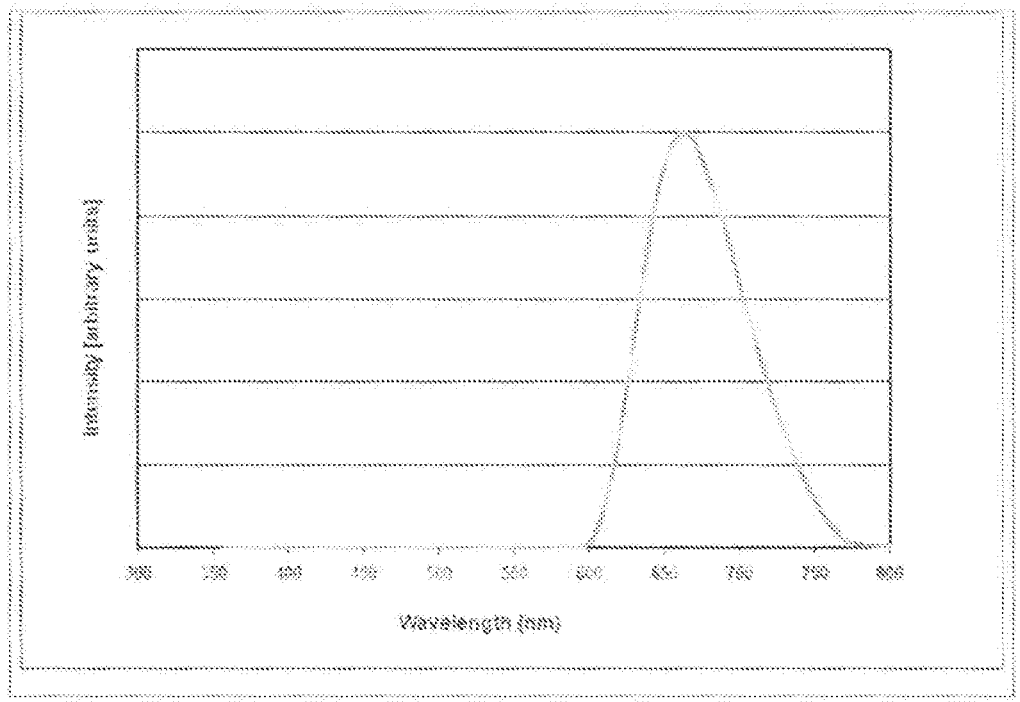
FIG. 6 shows the embodiment 60 with the emission peaks of a third single light emission source LED and quantum dot device according to the invention.

In FIG. 6, the semiconductor LED chip emission frequency peaks at a wavelength of 452 nm with emission peak Full Width at Half Maximum (FWHM) of 25 nm (not shown in FIG. 6). In this case the wavelength up-conversion is done by using one up-conversion quantum dot material. FIG. 6 shows the emission peak from this up-conversion material peaking at 658 nm wavelength with emission peak FWHM of 80 nm. In this case about 100% (calculated from the peak intensities) of the semiconductor LED chip emission, is up-converted to 658 nm emission by the quantum dot up-conversion material. This can be noticed from the FIG. 6, as there is no 452 nm emission exiting the LED and quantum dot device.

It should be noted that the spectrum 60 can be used and implemented together with conventional LEDs. Spectrum 60 can be implemented also by at least one quantum dot and at least one LED in combination in accordance with the invention. The spectrum 60 is especially suited to be used for illuminating at least one plant in a dark growth cavity, or a cavity with low levels of ambient light.

It should also further be noted that the embodiment 60 can be readily permuted and/or combined with any of the embodiments 10, 20, 30, 31, 40, 50, 70 and/or 80.

Figure 7:
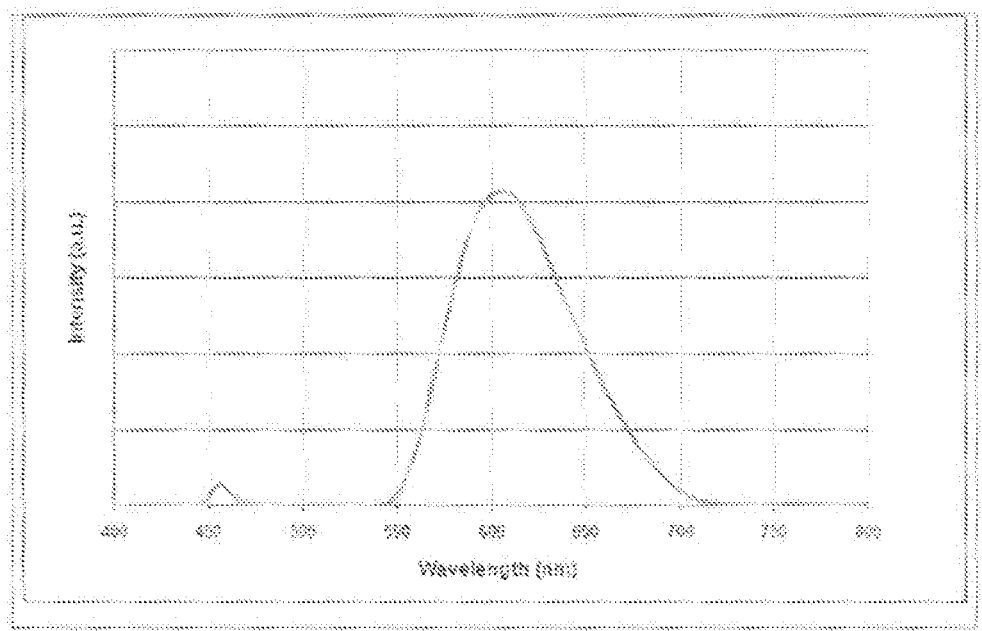
FIG. 7 shows the embodiment 70 with the emission peaks of a fourth single light emission source LED and quantum dot device according to the invention.

In FIG. 7, the semiconductor LED chip emission frequency peaks at a wavelength of 452 nm wavelength with emission peak Full Width at Half Maximum (FWHM) of 25 nm. In this case the wavelength up-conversion is done by using one up-conversion quantum dot material. FIG. 7 shows the emission peak from this up-conversion material peaking at 602 nm wavelength with emission peak FWHM of 78 nm. In this case about 95% (calculated from the peak intensities) of the semiconductor LED chip emission, is up-converted to 602 nm emission by the wavelength up-conversion quantum dot material.

It should be noted that the spectrum 70 can be used and implemented together with conventional LEDs. Spectrum 70 can be implemented also by at least one quantum dot and at least one LED in combination in accordance with the invention. The spectrum 70 is especially suited to be used for illuminating at least one plant in a dark growth cavity, or a cavity with low levels of ambient light.

It should also further be noted that the embodiment 70 can be readily permuted and/or combined with any of the embodiments 10, 20, 30, 31, 40, 50, 60 and/or 80.

Figure 8:
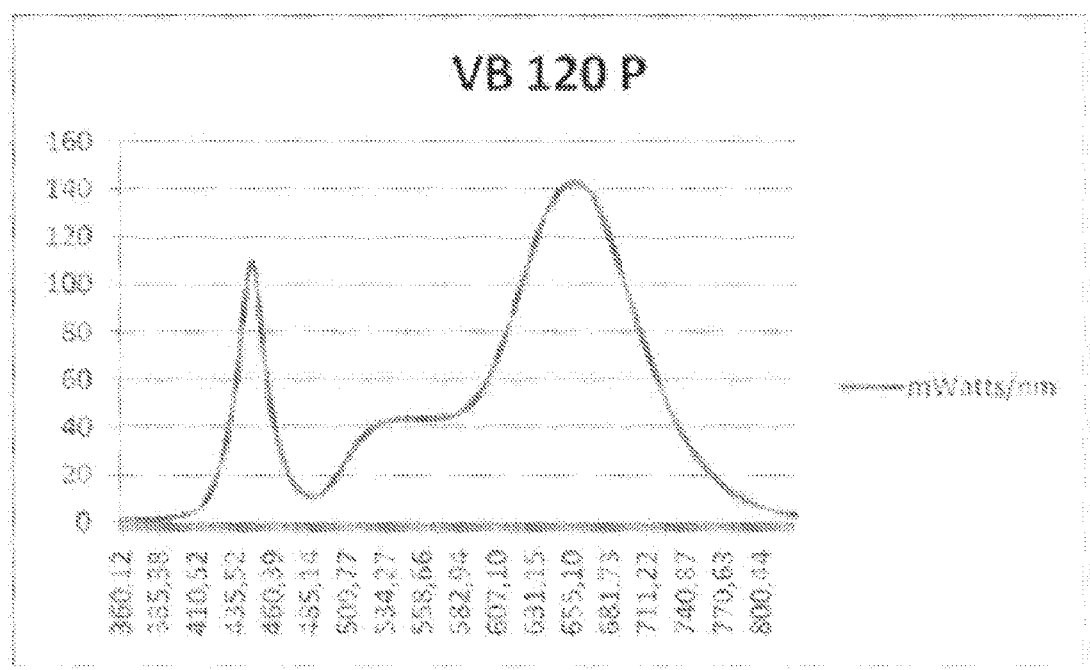
FIG. 8 shows the embodiment 80 with the spectrum that has been discovered to maximize the biomass of plants according to the invention.

FIG. 8 shows an optimised spectrum 80 that maximises biomass production in plants. The optimised spectrum is preferably produced with the lighting devices of the invention described in this application. Spectrum 80 has special advantages in growth chamber cultivation, where the growth chamber is a dark chamber, i.e. has zero or low levels of sunlight and/or ambient light. The light device of the invention producing spectrum 80 can be placed into said chamber and maximise biomass production in accordance with the invention. The inventor has experimentally discovered the biomass maximising feature of spectrum 80.

It should also further be noted that the embodiment 80 can be readily permuted and/or combined with any of the embodiments 10, 20, 30, 31, 40, 50, 60 and/or 70.

The used LED and the up converting quantum dot materials and sizes should be selected in the way that a desired emission spectra from the LED and the quantum dot device is achieved.

To summarize, by tuning the LED wavelength, LED spectra and intensity, quantum dot species and/or quantum dot size distribution it is possible to tune the desired emission spectra from the LED and quantum dot device and by tuning the quantum dot number it is possible to tune the desired up converted quantum dot chip emission quantity/amount for the combined LED and quantum dot device.

The present invention also concerns a lighting fixture for facilitating plant growth comprising at least one up conversion quantum dot having spectral characteristics including a peak in the wavelength range from 600 to 700 nm.

By using this approach, the light sources can be designed to reach superior PPF and PPF per watt efficiency and performance and very low power consumption and very long operation lifetime when compared to the existing technologies.

In some embodiments the emission at a frequency of 300-500 nm is generated by the semiconductor LED chip and the emission at frequency of 400-800 nm is generated using a complete or partial wavelength up-conversion of the LED chip radiation power. The partial wavelength up-conversion can be selected to be in range of 5-95%, preferably 35-65%, of the semiconductor LED chip radiation. The wavelength up-conversion to produce the 400-800 nm radiation is achieved by using one or more quantum dot up-conversion materials in proximity with the LED emission source in some embodiments.

In this application "adjustable" peak wavelength as in the above is construed as a peak wavelength that can be adjusted during assembly of the lighting fixture at the factory, and/or also "adjustable" as in an adjustable dial in the lighting fixture for on site peak wavelength adjustment. In addition adjusting the peak wavelengths of the LEDs and/or quantum dots during manufacturing process of the device is also in accordance with the invention, and "adjustable" should be construed to also include adjustments made during the manufacturing process of the LED and/or quantum dot. All aforementioned embodiments of an adjustable peak wavelength, or any other adjustable light source or LED and/or quantum dot variable are within the scope of this patent application.

In one special exemplary embodiment of the invention CdSe—ZnS (core-shell) quantum dot nano particles with average particle size of 6.6 nm with approximately +/−0.5 nm particle size distribution were mixed with a two component silicone encapsulant resin. The mixing ratio was 0.2 w-% of nano particles in the silicone resin. The resin containing nano particles were dispensed as encapsulant into a plastic leaded chip carrier (PLCC) consisting a InGaN light emitting diode in the PLCC cavity. The light emitting diodes was determined to have electroluminescent emission at 450 nm wavelength range.

The InGaN containing PLCC package with nano particles containing encapsulant material was connected to a DC voltage power source with forward voltage of 3.2V and current of 350 mA. The device optical emission spectrum was characterized to result in two emission peaks one at 450 nm wavelength range and the second at the 660 nm wavelength range.

The 660 nm wavelength range emission peak's full width at half maximum was observed to be over approximately 60 nm. The intensity ratios of the 450 nm and 660 nm peaks were 0.5:1. The aforementioned experiment has been conducted by the applicant.

It is in accordance with the invention to include LEDs and quantum dots with different peak emissions in one luminaire and to control these in order to provide a desirable spectral emission to achieve a determined growth result or physiological response. In this way, the lighting system would allow a versatile control of lighting intensity and spectrum. Ultimately, the control of other abiotic parameters such as $CO_2$ concentration, temperature, daylight availability and humidity could be integrated within the same control system together with lighting, optimizing the crop productivity and the overall management of the greenhouse.

The invention has been explained above with reference to the aforementioned embodiments and several commercial and industrial advantages have been demonstrated. The methods and arrangements of the invention allow more precise spectral tuning of the emission spectrum for lights used in plant cultivation. The invention therefore realises unexpected improvements in the photomorphogenetic control of plant growth, and further improvements in plant production. The invention also considerably improves the energy efficiency of plant cultivation relying on artificial light. Furthermore, the quality of the harvests is considerably improved with the light devices of the invention and this brings a multitude of advantages related to cultivation in dark growth chambers or chambers with very limited ambient light: Firstly plants may be grown closer to the site of consumption, e.g. in residential basements in big cities, thereby eliminating transportation costs. Secondly, plants may be grown in geographies where agriculture is not traditionally possible, e.g. hot desert conditions in the summer. Thirdly, as the quality of the plants is improved also the consistency between individual plants is improved which makes harvesting easier. This is because there are less rejected individuals and machine vision based harvesting equipment can recognize the plants better when they have a consistent quality, size and colour. Fourthly, the properties of the plants may be varied in a controlled fashion because nearly all growth parameters are under control, which is especially advantageous when cultivating flowers and ornamental plants. Fifthly, a constant photon dose every-day for the plants assists in the administration of nutrients, as the nutrient dose can be maintained the same year round. Sixthly, in very hot and sunny geographies plants may be grown in opaque growth chambers that reflect sunlight. The energy spent in the artificial illumination of the plant in accordance with the invention is considerably less than what would have been expended in air conditioning or cooling the plant under sunlight. The invention is especially advantageous for greenhouses that already have legacy LED systems. These LED systems can often just be upgraded by adding the quantum dot array of the invention to arrive at the lighting solution of the invention.

The invention has been explained above with reference to the aforementioned embodiments. However, it is clear that the invention is not only restricted to these embodiments, but comprises all possible embodiments within the spirit and scope of the inventive thought and the following patent claims.

REFERENCES

WO 2010/053341 A1, "Phosphor conversion light-emitting diode for meeting photomorphogenetic needs of plants", Zukauskas et al. 2010.
WO 2009/048425 A1, "Fabrication of Phosphor free red and white nitride-based LEDs", Soh et al. 2009.

The invention claimed is:

1. A light emitting component of a horticultural light, comprising:
   a light emitting diode (LED) semiconductor chip; and
   a light wavelength up-conversion quantum dot which is deposited in direct proximity of the LED semiconductor chip;
   wherein the light emitting component is configured to emit two characteristic light emission peaks, the light emission at wavelengths of 500-600 nm being reduced below the intensity in the 400-500 nm band and below the intensity in the 600-700 nm band, and
   the wavelength up-conversion quantum dot is configured to convert part of the light emission energy emitted by the semiconductor chip to the wavelength of 700 to 800 nm.

2. The light emitting component of claim 1, wherein the light wavelength up-conversion quantum dot is deposited directly on the surface of the LED chip or spaced out with other optical material.

3. The light emitting component of claim 1, wherein the light emitting diode (LED) semiconductor chip has peak emission within the range of 440 to 500 nm.

4. The light emitting component of claim 1, wherein the wavelength up-conversion quantum dot is configured to convert part of the light emission energy emitted by the semiconductor chip to the wavelength of 600 to 700 nm.

5. The light emitting component of claim 1, wherein the two characteristic light emission peaks are at 440 nm-500 nm and 600-700 nm, respectively.

6. The light emitting component of claim 1, wherein the two characteristic light emission peaks omit spectral characteristics one at least 50 nm full width of half maximum and another maximum of 50 nm full width at half maximum and both at different wavelength ranges.

7. A method for enhancing plant growth, comprising:
   emitting light, by the at least one light emitting component of claim 1, to at least one plant with the said at least one plant in ambient light or in a dark cavity with said lighting device or fixture as the sole source of light.

* * * * *